US010062674B1

(12) United States Patent
Ellison et al.

(10) Patent No.: US 10,062,674 B1
(45) Date of Patent: Aug. 28, 2018

(54) SYSTEMS AND METHODS FOR DISPLAY FORMATION USING PHOTO-MACHINABLE MATERIAL SUBSTRATE LAYERS

(71) Applicant: Corning Incorporated, Corning, NY (US)

(72) Inventors: Adam James Ellison, Corning, NY (US); Sean Matthew Garner, Elmira, NY (US); Timothy James Kiczenski, Corning, NY (US); Michelle Diane Pierson-Stull, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/581,319

(22) Filed: Apr. 28, 2017

(51) Int. Cl.
| *H01L 23/13* | (2006.01) |
| *H01L 25/075* | (2006.01) |
| *H01L 33/48* | (2010.01) |
| *H01L 27/12* | (2006.01) |
| *C03C 15/00* | (2006.01) |
| *H01L 25/16* | (2006.01) |
| *H01L 23/15* | (2006.01) |
| *C03C 23/00* | (2006.01) |
| *C03B 17/02* | (2006.01) |

(52) U.S. Cl.
CPC .......... *H01L 25/0753* (2013.01); *C03B 17/02* (2013.01); *C03C 15/00* (2013.01); *C03C 23/002* (2013.01); *C03C 23/0005* (2013.01); *C03C 23/0025* (2013.01); *H01L 23/13* (2013.01); *H01L 23/15* (2013.01); *H01L 25/165* (2013.01); *H01L 25/167* (2013.01); *H01L 27/1218* (2013.01); *H01L 27/1262* (2013.01); *H01L 33/483* (2013.01); *H01L 2933/0033* (2013.01)

(58) Field of Classification Search
None
See application file for complete search history.

(56) References Cited

U.S. PATENT DOCUMENTS

| 9,340,451 B2 * | 5/2016 | Boek ........................ C03C 15/00 |
| 2008/0299501 A1 * | 12/2008 | Borrelli ................... C03C 3/095 |
| | | 430/323 |
| 2015/0049498 A1 | 4/2015 | Zhou |
| 2015/0210074 A1 | 7/2015 | Chen et al. |
| 2017/0345643 A1 * | 11/2017 | Younkin ............. H01L 21/0271 |

* cited by examiner

*Primary Examiner* — Minh-Loan Tran
(74) *Attorney, Agent, or Firm* — Gregory V. Bean; Ryan T. Hardee

(57) ABSTRACT

Embodiments are related to scalable surface structure (e.g., a well or other structure) formation in a substrate and, more particularly, to systems and methods for forming displays using a photo-machinable material layer.

26 Claims, 4 Drawing Sheets

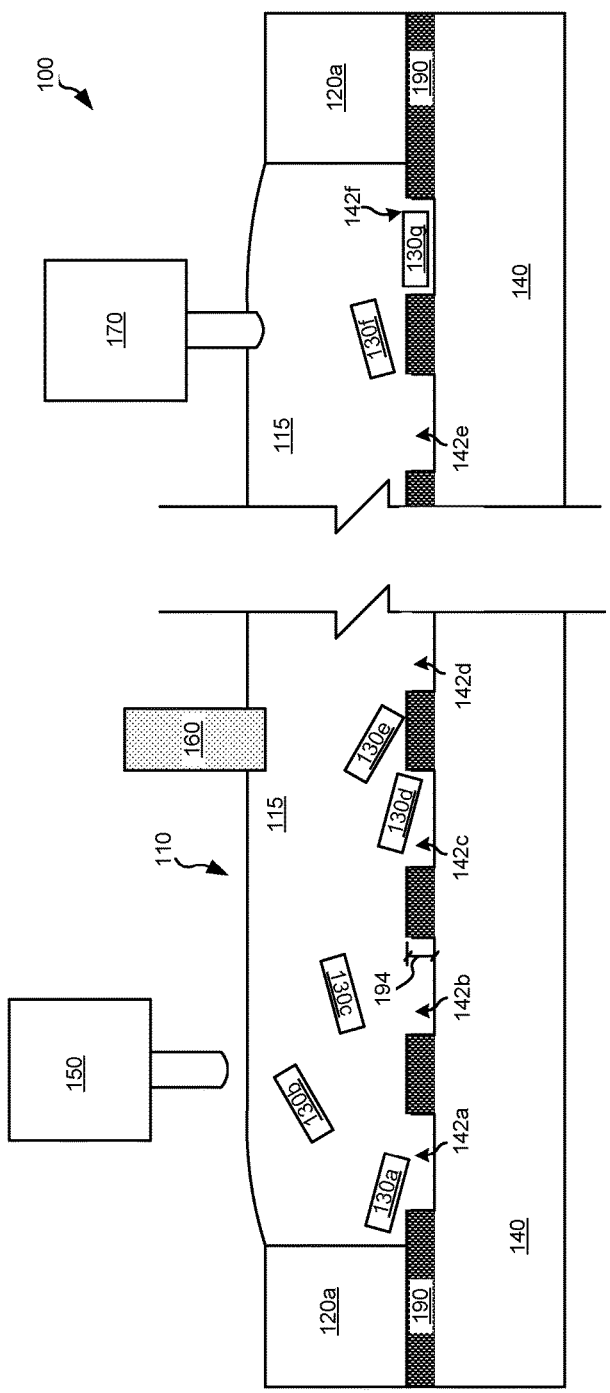
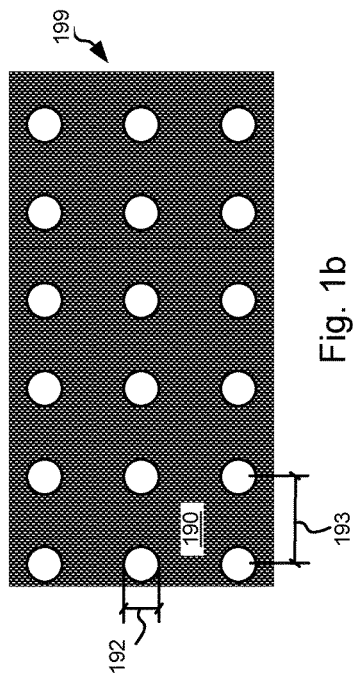
Fig. 1a
Fig. 1b

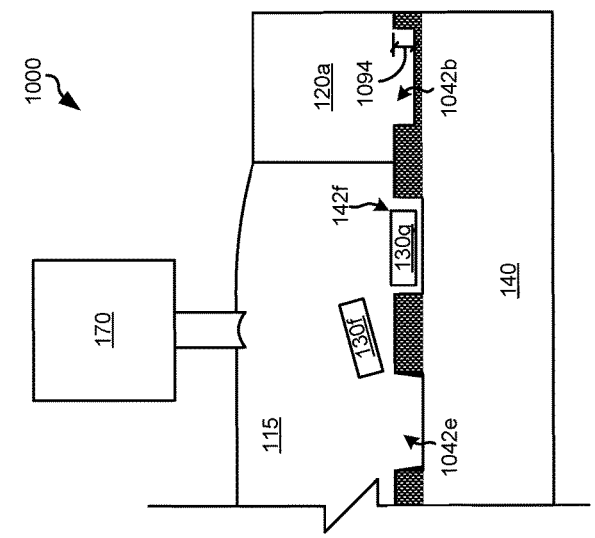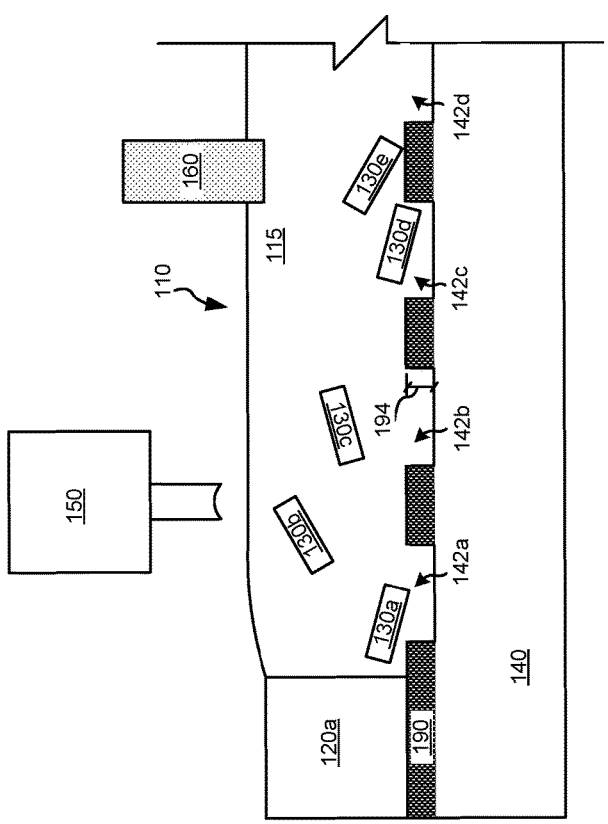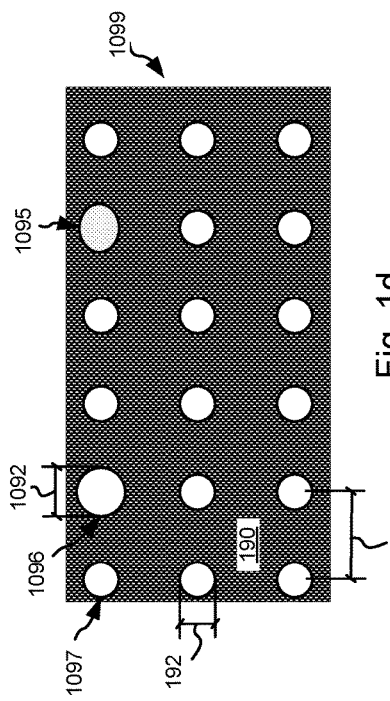

US 10,062,674 B1

SYSTEMS AND METHODS FOR DISPLAY FORMATION USING PHOTO-MACHINABLE MATERIAL SUBSTRATE LAYERS

FIELD OF THE INVENTION

Embodiments are related to scalable surface structure (e.g., a well or other structure) formation in a substrate and, more particularly, to systems and methods for forming displays using a photo-machinable material layer.

BACKGROUND

LED displays, LED display components, and arrayed LED devices include a large number of diodes placed at defined locations across the surface of the display or device. Fluidic assembly may be used for assembling diodes in relation to a substrate. Such assembly is often a stochastic process whereby LED devices are deposited into wells on a substrate. Forming such wells into the surface of a substrate using traditional laser damage and etch processes are done one location at a time. As such forming several million wells in the surface of a substrate is prohibitively expensive.

Hence, for at least the aforementioned reasons, there exists a need in the art for advanced systems and methods for manufacturing physical structures on a substrate.

Embodiments are related to scalable well formation in a substrate and, more particularly, to systems and methods for forming displays using a photo-machinable material layer.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIGS. 1a-1d depict a fluidic assembly system capable of moving a suspension composed of a carrier liquid and a plurality of physical objects relative to a photo-machinable material layer atop a surface of a substrate in accordance with one or more embodiments of the present inventions;

DETAILED DESCRIPTION OF SOME EMBODIMENTS

Figure 2:
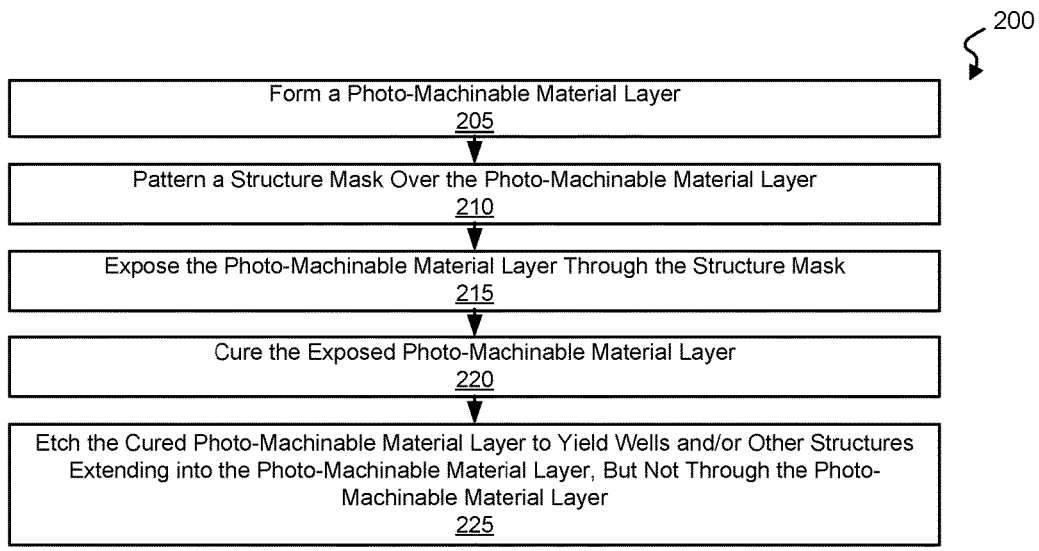
FIG. 2 is a flow diagram depicting a method in accordance with some embodiments of the present inventions for forming a patterned device assembly including wells defined in a photo-machinable material layer.

Embodiments are related to scalable surface structure (e.g., a well or other structure) formation in a substrate and, more particularly, to systems and methods for forming displays using a photo-machinable material layer.

Various embodiments rely upon local crystallization of a substrate material followed by a chemical etch that removes the locally crystallized regions while leaving uncrystallized regions largely intact. In some cases, the substrate material is a photo-machinable glass substrate. In some such cases, the wells formed in the photo-machinable glass substrate may extend into the surface of the substrate, but not all the way through the substrate. In other such cases, the wells formed in the photo-machinable glass substrate extend all the way through the substrate, and another layer is laminated to the etched photo-machinable glass substrate. The combination of the previously through-hole etched photo-machinable glass substrate and the additional layer result in substantially planar well bottoms where the well bottoms consist of a portion of a top surface of the other layer exposed by the through-holes etched in the photo-machinable glass substrate. In various cases, the substrate material is a compound material including a photo-machinable glass layer on top of another layer. This additional layer is substantially less susceptible to an etch chemical applied to the photo-machinable glass layer and acts as an etch stop when through holes are formed in the photo-machinable glass layer. Such an etch stop results in substantially planar well bottoms where the well bottoms consist of a portion of a top surface of the other layer exposed by the through-holes etched in the photo-machinable glass substrate. In various cases, the photo-machinable glass layer is made of Fotoform™. In some cases, the composition of the photo-machinable glass layer is alkali free.

Various embodiments provide display devices that include a photo-machinable material layer. As used herein, the phrase "display device" is used in its broadest sense to mean any device that includes a display. As just some example, a display device may be, but is not limited to, a wearable device having a display, a mobile phone, a tablet computer, a television, or a sign. A plurality of structures are defined within the photo-machinable material layer, and include at least one opening operable to accept a microdiode. In some instances of the aforementioned embodiments, the plurality of structures extend only partially through the photo-machinable material layer such that a bottom of each of the respective plurality of structures is within the photo-machinable material layer. In other instances of the aforementioned embodiments, the plurality of structures extend completely through the photo-machinable material layer. In some cases, a material of the photo-machinable material layer is an alkali-containing material. In other cases, a material of the photo-machinable material layer is an alkali-free material. In various cases, the photo-machinable material layer is transparent.

In one or more instances of the aforementioned embodiments, the device further includes another material layer. The other material layer is formed of a material different from the material of the photo-machinable material layer, and the other material layer is connected to the photo-machinable material layer. In such instances, the plurality of structures may extend through the photo-machinable material layer such that a bottom of each of the respective plurality of structures is a portion of a surface of the other material layer. In some such instances, the material of the other material layer is glass. In various of such instances, the material of the other material layer is a photodefinable material with different photodefinable characteristics than the photodefinable characteristics of the material of the photo-machinable material layer. In some instances of the aforementioned embodiments, the photo-machinable material layer and include more than ten thousand openings within the photo-machinable material layer. In yet other instances of the aforementioned embodiments, the photo-machinable material layer and include more than one hundred thousand openings within the photo-machinable material layer. In yet further instances of the aforementioned embodiments, the photo-machinable material layer and include more than one million openings within the photo-machinable material layer.

In some instances of the aforementioned embodiments, the plurality of structures includes at least one channel having a length, a width and a depth. The length is greater than the width. At least one opening is an extension from the length of the channel, and a depth of the at least one opening is the same as the depth of the channel. In various instances of the aforementioned embodiments, the photo-machinable material layer and include more than one thousand openings within the photo-machinable material layer.

Other embodiments provide assembly panel devices that include a photo-machinable material layer. A plurality of structures are defined within the photo-machinable material layer and include more than one million openings within the photo-machinable material layer. Each of the at least one million openings exhibits maximum width of less than one hundred fifty (i.e., 150) micrometers and a maximum depth of less than ten micrometers. In particular cases, each of the at least one million openings exhibits maximum width of less than one hundred micrometers. In other cases, each of the at least one million openings exhibits maximum width of less than sixty micrometers. In yet other cases, each of the at least one million openings exhibits maximum width of less than forty micrometers. In one or more cases, each of the at least one million openings exhibits maximum depth of less than five micrometers. In yet other cases, each of the at least one million openings exhibits maximum depth of less than three micrometers. In some cases, the photo-machinable material layer is transparent. In other cases, the photo-machinable material can be scattering, opaque, or colored. In various cases, a material of the photo-machinable material layer is an alkali-containing material. In other cases, a material of the photo-machinable material layer is an alkali-free material.

In various instances of the aforementioned embodiments, each of the more than one million openings within the photo-machinable material layer extends only partially through the photo-machinable material layer such that a bottom of each of the respective openings is within the photo-machinable material layer. In other instances, each of the more than one million openings within the photo-machinable material layer extends completely through the photo-machinable material layer such that a bottom of each of the respective openings is within the photo-machinable material layer.

In one or more instances of the aforementioned embodiments, the devices further include another material layer. This other material layer is formed of a material different from the material of the photo-machinable material layer, and is connected to the photo-machinable material layer. In some such instances, the plurality of structures extend through the photo-machinable material layer such that a bottom of each of the respective openings is a portion of a surface of the other material layer. In some cases, the material of the other material layer is glass, ut may also be glass ceramic, ceramic, metal polymer, or some combination of the aforementioned materials. In various cases, the the material of the other material layer is a photodefinable material with different photodefinable characteristics than the photodefinable characteristics of the material of the photo-machinable material layer.

Turning to FIG. 1a, a fluidic assembly system 100 is shown that is capable of moving a suspension 110 composed of a carrier liquid 115 and a plurality of physical objects 130 relative to a photo-machinable material layer 190 atop a surface of a substrate 140 in accordance with one or more embodiments of the present inventions. Although the example discussed in relation to FIGS. 1a-1b focuses on fluidically placed physical objects, the substrate which includes a photo-machinable layer can be used for other assembly methods as well. For example, this can be used for pick-n-place or other variations. The physical objects 130 can include electronic elements, diodes, microLEDs, and other objects.

As used herein, the phrase "photo-machinable material" is used in its broadest sense to mean any photodefinable material. In some embodiments, the photo-machinable material is a material that can be locally crystallized using some type of exposure process such as, for example, exposure to ultraviolet radiation. A chemical etch may then be used to remove crystallized regions at a rate that is much faster that surrounding regions are removed (e.g., twenty times faster). This allows for forming structures in photo-machinable material layer 190 where unexposed portions of photo-machinable material layer 190 remain and exposed portions are either completely or partially removed. In some embodiments, substrate 140 is a glass substrate that has different properties than photo-machinable material layer 190. In particular cases, the photo-machinable material is Fotoform™. In various cases, the composition of the photo-machinable material is alkali free. In one particular embodiment, one of substrate 140 and photo-machinable material layer 190 is alkali free, and the other of substrate 140 and photo-machinable material layer 190 is alkali-containing. Being alkali free facilitates thin-film-transistor formation. The lamination, coating, deposition or other build-up of the combination of substrate 140 and photo-machinable material layer 190 may be done either before or after forming electronic circuitry on one or more of substrate 140 and photo-machinable material layer 190. In some cases, the combination of substrate 140 and photo-machinable material layer 190 may be rigid, and in other cases the combination may be flexible.

In some cases, physical objects 130 may be micro-diodes, however, in other cases the physical objects may be other electronic devices or non-electronic devices. Turning to FIG. 1*b*, an example top view 199 of the surface of substrate 140 is shown with an array of wells (shown as circles) extending into photo-machinable material layer 190. Each of wells 142 has a diameter 192 and a depth 194. It should be noted that while wells 142 are shown as circular in cross-section that other shapes may be used in relation to different embodiments. For example, other shapes, such as, for example, square, trapezoid, or other arbitrary shapes may be supported using different embodiments of the present inventions. In some embodiments, substrate 140 is a glass substrate and diameter 192 is sixty (60) micrometers or less formed in photo-machinable material layer 190 at five hundred (500) micrometers offsets 193 or less. Depth 193 is less than ten (10) micrometers. In some embodiments photo-machinable material layer 190 is formed over substrate 140 using a patterning process including masking, exposing portions of photo-machinable material layer 190 through the mask, and etching to remove the exposed portions leaving wells 142. It should be noted that while in some embodiments the bottom of wells are formed of a portion of a top surface of substrate 140 where through holes are formed in photo-machinable material layer 190, in other embodiments substrate 140 and photo-machinable material layer 190 are a single layer of photo-machinable material into which wells 142 are defined that extend only part way through the layer of photo-machinable material.

In some cases, the thickness of photo-machinable material layer 190 is substantially equal to the height of physical objects 130 where the aforementioned etching is used to form a through hole extending to a top surface of substrate 140. In other cases, the thickness of photo-machinable material layer 190 is greater than the thickness of physical objects 130 where wells 142 are to be formed entirely within photo-machinable material layer 190. In other cases, the thickness of the photo-machinable material layer is less than the thickness of physical objects. Note that a variety of physical objects that vary in size, shape, thickness, and composition can be assembled onto a substrate that includes a photo-machinable layer. An inlet opening of wells 142 is greater that the width of physical objects 130 such that only one physical object 130 deposits into any given well 142. It should be noted that while embodiments discuss depositing physical objects 130 into wells 142, that other devices or objects may be deposited in accordance with different embodiments of the present inventions.

A depositing device 150 deposits suspension 110 over the surface of substrate 140 with suspension 110 held on top of substrate 140 by sides 120 of a dam structure. In some embodiments, depositing device 150 is a pump with access to a reservoir of suspension 110. A suspension movement device 160 agitates suspension 110 deposited on substrate 140 such that physical objects 130 move relative to the surface of substrate 140. As physical objects 130 move relative to the surface of substrate 140 they deposit into wells 142. In some embodiments, suspension movement device 160 is a brush that moves in three dimensions. Based upon the disclosure provided herein, one of ordinary skill in the art will recognize a variety of devices that may be used to perform the function of suspension movement device 160 including, but not limited to, a pump.

A capture device 170 includes an inlet extending into suspension 110 and capable of recovering a portion of suspension 110 including a portion of carrier liquid 115 and non-deposited physical objects 130, and returning the recovered material for reuse. In some embodiments, capture device 170 is a pump. In some cases, substrate 140 including photo-machinable material layer 190 is formed using one or more of the processes discussed below in relation to FIGS. 2-5.

The combination of substrate 140 and photo-machinable material layer 190 may exhibit not only physical features such as wells 142 shown in fluidic assembly system 100, fluidic channels, or other physical surface structures, but also mechanical characteristics like the rigidity or flexibility discussed above, but also can be chosen or formed to exhibit specific optical properties. For example, in terms of optical properties, the combination of substrate 140 and photo-machinable material layer 190 can remain substantially transparent, have regions of being opaque to block or isolate light, have regions of a specific optical absorption, or have regions of controlled optical scattering. Patterning of the combination of substrate 140 and photo-machinable material layer 190 may occur on only a top surface as shown in fluidic assembly system 100, or on both a top and bottom surface. Two-dimensional shape of the physical features can be controlled using a proper photomask, and the vertical sidewall angle of the physical structures while shown in FIG. 1*a* as being purely vertical can be angled or otherwise shaped as shown in well 1042*e* in FIG. 1*c*. The bottom of the surface features can be rounded or flat. The roughness can be controlled to be textured or smooth. The physical dimensions, shape, and roughness can be controlled through a combination of photoexposure, wet etch, dry etch, deposited or solution-based coatings, and laminated layers. Different types of processing may occur for each of the different types of layers in the substrate. The size, depth, and/or shape of the wells within photo-machinable material layer 190 can exhibit some variance as shown in FIGS. 1*c*-1*d*. FIGS. 1*c*-1*d* show a fluidic assembly system 1000 and a top view 1099 where a depth 1094 of a well 1042*b* is less than depth 194 of well 142*b*, a shape of well 1042*e* is different from a shape of well 142*a*, a size of well 1096 varies from the size of a well 1097, a size of well 1042*a* is different from a size of well 142*c*, and a shape of well 1095 is different from a shape of well 1097.

Turning to FIG. 2, a flow diagram 200 depicts a method in accordance with some embodiments of the present inventions for forming a patterned device assembly including wells defined in a photo-machinable material layer. This method involves etching partially through a photo-machinable material layer to define structures and is particularly suited where, for example, substrate 140 and photo-machinable material layer 190 are both formed of the same photo-machinable material which is processed to yield the desired structures. Following flow diagram 200, a photo-machinable material layer is formed (block 205). As just one of many examples, such a photo-machinable material layer may be formed, for example, by depositing a portion of photo-definable material in a liquid state and allowing it to harden to yield a photo-machinable material layer. At this point, a surface of the photo-definable material layer may be polished to yield a planar surface.

A structure mask is formed over the photo-machinable material layer (block 210). This structure mask may define any structures to be formed in the photo-definable material layer including, but not limited to, wells similar to those shown above in relation to FIGS. 1*a*-1*b*. Based upon the disclosure provided herein, one of ordinary skill in the art will recognize a variety of structures that may be defined in accordance with different embodiments of the present inventions.

The photo-machinable material layer is exposed through the structure mask (block 215). This exposure may include, for example, exposing regions of the photo-machinable material layer through openings in the structure mask to ultraviolet radiation. Based upon the disclosure provided herein, one of ordinary skill in the art will recognize a variety of exposure processes that may be used depending upon the particular characteristics of the photo-definable material. The exposed photo-definable material layer is cured (block 220). This curing leaves exposed portions of the photo-machinable material layer susceptible to a chemical etch with a different rate than that of the non-exposed portions of the photo-machinable material layer. In some cases, the curing process includes thermally treating the exposed photo-machinable material layer. Based upon the disclosure provided herein, one of ordinary skill in the art will recognize a variety of curing processes that may be used depending upon the particular characteristics of the photo-definable material.

A chemical etch is performed on the cured photo-machinable material layer until wells and/or other structures are opened into the photo-machinable material layer (block 225). The chemical etch is stopped once the depth of the wells and/or other structures extend a defined distance from the surface of the photo-machinable material layer, and leaving a portion of the photo-machinable material layer at the bottom of the structures such that no through holes are formed. In some cases, the chemical etch is an HF etch. Based upon the disclosure provided herein, one of ordinary skill in the art will recognize a variety of chemical etches that may be used depending upon the particular characteristics of the photo-definable material.

Figure 3:
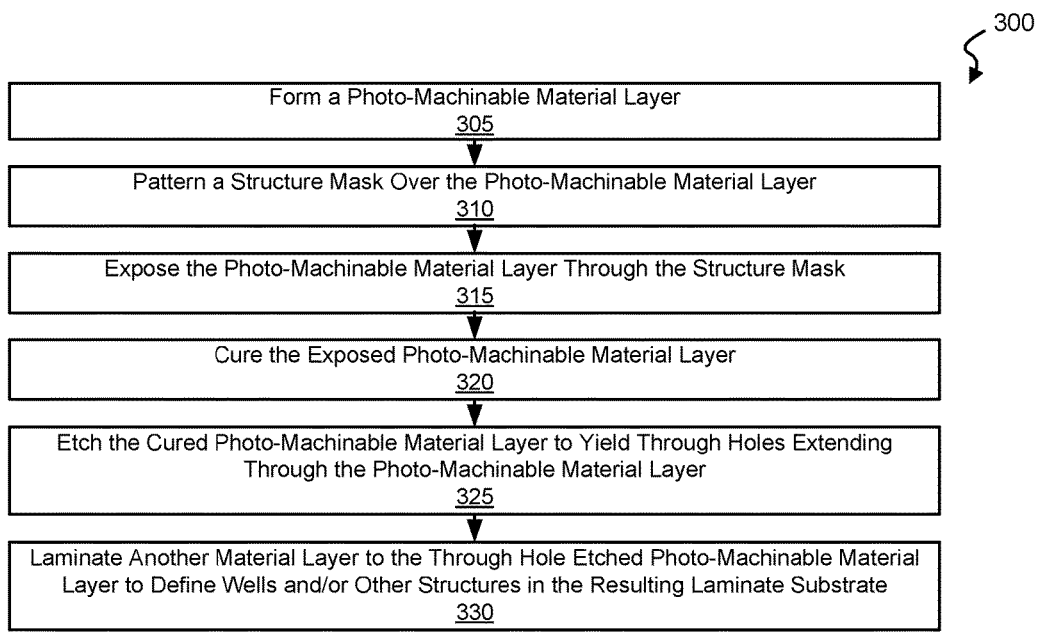
FIG. 3 is a flow diagram depicting another method in accordance with other embodiments of the present inventions for forming a patterned device assembly including through-holes defined in a photo-machinable material layer and well bottoms formed of another material layer laminated to the photo-machinable material layer.

Turning to FIG. 3, a flow diagram 300 depicts another method in accordance with various embodiments of the present inventions for forming a patterned device assembly including through-holes defined in a photo-machinable material layer and well bottoms formed of another material layer laminated to the photo-machinable material layer. This method involves etching completely through a photo-machinable material layer to define structures and is particularly suited where, for example, substrate 140 is laminated to photo-machinable material layer 190 after the structures are formed. Following flow diagram 300, a photo-machinable material layer is formed (block 305). As just one of many examples, such a photo-machinable material layer may be formed, for example, by depositing a portion of photo-definable material in a liquid state and allowing it to harden to yield a photo-machinable material layer. At this point, a surface of the photo-definable material layer may be polished to yield a planar surface.

A structure mask is formed over the photo-machinable material layer (block 310). This structure mask may define any structures to be formed in the photo-machinable material layer including, but not limited to, wells similar to those shown above in relation to FIGS. 1a-1b. Based upon the disclosure provided herein, one of ordinary skill in the art will recognize a variety of structures that may be defined in accordance with different embodiments of the present inventions.

The photo-machinable material layer is exposed through the structure mask (block 315). This exposure may include, for example, exposing regions of the photo-machinable material layer through openings in the structure mask to ultraviolet radiation. Based upon the disclosure provided herein, one of ordinary skill in the art will recognize a variety of exposure processes that may be used depending upon the particular characteristics of the photo-machinable material. The exposed photo-machinable material layer is cured (block 320). This curing leaves exposed portions of the photo-machinable material layer susceptible to a chemical etch with a different rate than that of the non-exposed portions of the photo-machinable material layer. In some cases, the curing process includes thermally treating the exposed photo-machinable material layer. Based upon the disclosure provided herein, one of ordinary skill in the art will recognize a variety of curing processes that may be used depending upon the particular characteristics of the photo-machinable material.

A chemical etch is performed on the cured photo-machinable material layer until wells and/or other structures are opened into the photo-machinable material layer (block 325). The chemical etch is stopped once the depth of the wells and/or other structures extend a defined distance from the surface of the photo-machinable material layer. This etch process may create through-holes through the photo-machinable material layer or just a surface patterning that exists partially through the substrate. In some cases, the chemical etch is an HF etch. Based upon the disclosure provided herein, one of ordinary skill in the art will recognize a variety of chemical etches that may be used depending upon the particular characteristics of the photo-machinable material.

Another material layer is laminated to the through-hole etched photo-machinable material layer to define wells and/or other structures in the resulting laminate substrate (block 330). The bottom of the respective wells and/or other structures is defined by a top surface of the other material layer laminated to the through-hole etched photo-machinable material layer, and the sidewalls of the wells and/or other structures are defined by the through-hole etched photo-machinable material layer. In some cases, the other material layer is a glass layer. Based upon the disclosure provided herein, one of ordinary skill in the art will recognize other materials that may be used to form the other material layer.

Figure 4:
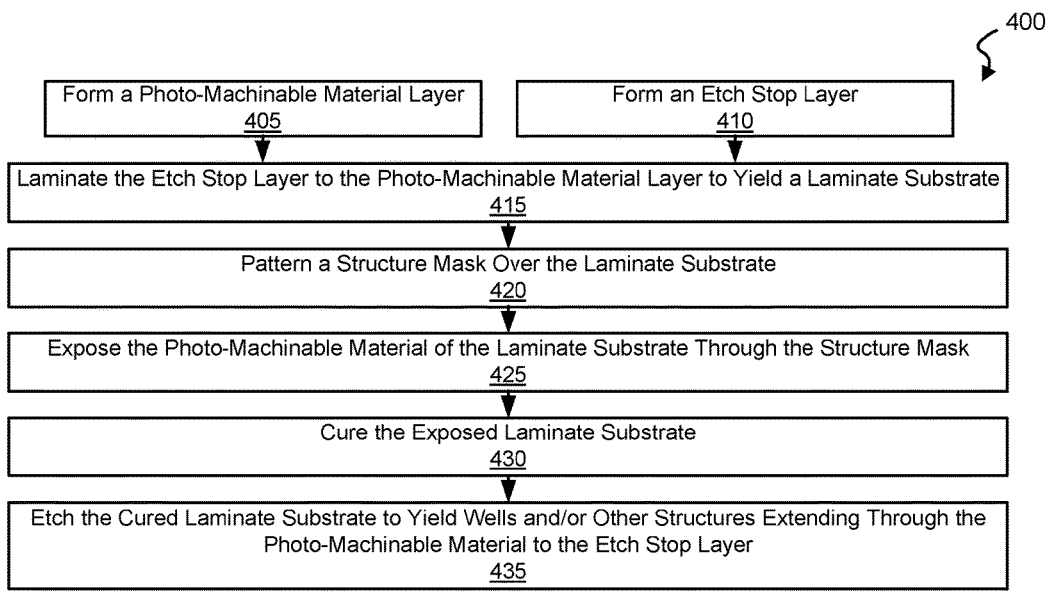
FIG. 4 is a flow diagram depicting another method in accordance with yet other embodiments of the present inventions for forming a laminate including a photo-machinable material layer and another material layer, and using the other material layer as an etch stop when etching wells into the photo-machinable material layer.

Turning to FIG. 4, a flow diagram 400 depicts another method in accordance with yet other embodiments of the present inventions for forming a laminate including a photo-machinable material layer and another material layer, and using the other material layer as an etch stop when etching wells and/or other structures into the photo-machinable material layer. This method involves etching completely through a photo-machinable material layer to define structures using a laminated material layer as an etch stop and is particularly suited where, for example, substrate 140 is laminated to photo-machinable material layer 190 before the structures are formed in photo-machinable material layer 190. Following flow diagram 400, a photo-machinable material layer is formed (block 405). As just one of many examples, such a photo-machinable material layer may be formed, for example, by depositing a portion of photo-definable material in a liquid state and allowing it to harden to yield a photo-machinable material layer. At this point, a surface of the photo-definable material layer may be polished to yield a planar surface. In parallel, an etch stop layer is formed (block 410). As just one of many examples, such an etch stop layer may be formed, for example, by depositing a portion of material which is less susceptible to a chemical etch than exposed portions of the photo-machinable material layer. The portion is deposited in a liquid state and allowed it to harden to yield an etch stop layer. At this point, a surface of the etch stop layer may be polished to yield a planar surface. The etch stop layer can also be combined with the photo-machinable layer by other methods such as through a lamination process.

The etch stop layer is laminated to the photo-machinable material layer to yield a laminate substrate (block 415). Any process known in the art for attaching the etch stop layer to the photo-machinable material layer may be used. A structure mask is formed over the photo-machinable material layer (block 420). This structure mask may define any structures to be formed in the photo-machinable material layer including, but not limited to, wells similar to those shown above in relation to FIGS. 1a-1b. Based upon the disclosure provided herein, one of ordinary skill in the art will recognize a variety of structures that may be defined in accordance with different embodiments of the present inventions.

The photo-machinable material layer is exposed through the structure mask (block 425). This exposure may include, for example, exposing regions of the photo-machinable material layer through openings in the structure mask to ultraviolet radiation. Based upon the disclosure provided herein, one of ordinary skill in the art will recognize a variety of exposure processes that may be used depending upon the particular characteristics of the photo-machinable material. The exposed laminate substrate is thermally treated or cured (block 430). This curing leaves exposed portions of the photo-machinable material layer susceptible to a chemical etch with a different rate than that of the non-exposed portions of the photo-machinable material layer. In some cases, the curing process includes thermally treating the exposed laminate substrate. Based upon the disclosure provided herein, one of ordinary skill in the art will recognize a variety of curing processes that may be used depending upon the particular characteristics of the photo-machinable material.

A chemical etch is performed on the cured laminate substrate until wells and/or other structures are opened into the photo-machinable material layer using the etch stop layer (block 435). The chemical etch is stopped once the etch stop layer is uncovered. In some cases, the chemical etch is an HF etch. Based upon the disclosure provided herein, one of ordinary skill in the art will recognize a variety of chemical etches that may be used depending upon the particular characteristics of the photo-machinable material.

Figure 5:
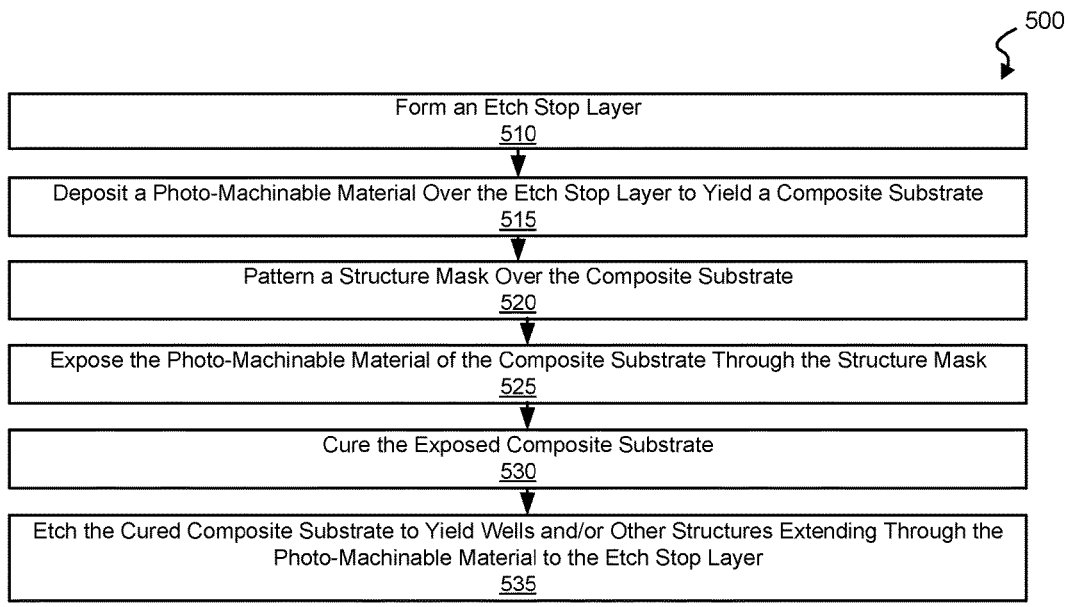
FIG. 5 is a flow diagram depicting another method in accordance with yet further embodiments of the present inventions for depositing a photo-machinable material layer on top of another material layer, and using the other material layer as an etch stop when etching wells into the photo-machinable material layer.

Turning to FIG. 5, a flow diagram 500 depicts another method in accordance with yet further embodiments of the present inventions for depositing a photo-machinable material layer on top of another material layer, and using the other material layer as an etch stop when etching wells into the photo-machinable material layer. This method involves etching completely through a photo-machinable material layer to define structures using a underyling material layer as an etch stop and is particularly suited where, for example, photo-machinable material layer 190 is deposited on substrate 140 before the structures are formed in photo-machinable material layer 190. Following flow diagram 500, an etch stop layer is formed (block 510). As just one of many examples, such an etch stop layer may be formed, for example, by depositing a portion of material which is less susceptible to a chemical etch than exposed portions of the photo-machinable material layer. The portion is deposited in a liquid state and allowed it to harden to yield an etch stop layer. At this point, a surface of the etch stop layer may be polished to yield a planar surface.

Photo-machinable material is deposited over the etch stop layer to yield a composite substrate (block 515). Such deposition of the photo-machinable material onto the etch stop layer may be done using any deposition process known in the art. A structure mask is formed over the photo-machinable material layer (block 520). This structure mask may define any structures to be formed in the photo-machinable material layer including, but not limited to, wells similar to those shown above in relation to FIGS. 1a-1b and channels with well extensions similar to those discussed above in relation to FIGS. 2a-2b. Based upon the disclosure provided herein, one of ordinary skill in the art will recognize a variety of structures that may be defined in accordance with different embodiments of the present inventions.

The photo-machinable material layer is exposed through the structure mask (block 525). This exposure may include, for example, exposing regions of the photo-machinable material layer through openings in the structure mask to ultraviolet radiation. Based upon the disclosure provided herein, one of ordinary skill in the art will recognize a variety of exposure processes that may be used depending upon the particular characteristics of the photo-machinable material. The exposed composite substrate is thermally treated or cured (block 530). This curing leaves exposed portions of the photo-machinable material layer susceptible to a chemical etch with a different rate than that of the non-exposed portions of the photo-machinable material layer. In some cases, the curing process includes thermally treating the exposed composite substrate. Based upon the disclosure provided herein, one of ordinary skill in the art will recognize a variety of curing processes that may be used depending upon the particular characteristics of the photo-machinable material.

A chemical etch is performed on the cured composite substrate until wells and/or other structures are opened into the photo-machinable material layer using the etch stop layer (block 535). The chemical etch is stopped once the etch stop layer is uncovered. In some cases, the chemical etch is an HF etch. Based upon the disclosure provided herein, one of ordinary skill in the art will recognize a variety of chemical etches that may be used depending upon the particular characteristics of the photo-machinable material.

In conclusion, the invention provides novel systems, devices, methods and arrangements for forming structures on a substrate. While detailed descriptions of one or more embodiments of the invention have been given above, various alternatives, modifications, and equivalents will be apparent to those skilled in the art without varying from the spirit of the invention. For example, while some embodiments are discussed in relation to forming and/or using wells or other structures for use in relation to fluidic assembly, it is noted that the embodiments find applicability to other structures including, but not limited to, surface roughening, fluidic steering features and/or other fluidic assembly features. In addition, substrates with these patterned features can be used in various device assembly methods that include fluidic assembly, pick-n-place assembly, or other methods. Therefore, the above description should not be taken as limiting the scope of the invention, which is defined by the appended claims.

What is claimed is:

1. An electronic device, the device comprising:
   a photo-machinable material layer;
   another material layer, wherein the other material layer is formed of a material different from the material of the photo-machinable material layer, and wherein the other material layer is attached to the photo-machinable material layer; and
   a plurality of structures defined within the photo-machinable material layer, wherein the plurality of structures extend through the photo-machinable material layer such that a bottom of each of the respective plurality of structures is a portion of a surface of the other material layer, and wherein the plurality of structures includes at least one opening operable to accept an electronic element.

2. The device of claim 1, wherein the electronic device is a display device.

3. The device of claim 1, wherein the electronic element is a micro-diode.

4. The device of claim 1, wherein the plurality of structures extend only partially through the photo-machinable material layer such that a bottom of each of the respective plurality of structures is within the photo-machinable material layer.

5. The device of claim 1, wherein the material of the other material layer is a material selected from a group consisting of: glass, glass-ceramic, ceramic, polymer, and metal.

6. The device of claim 1, wherein the material of the other material layer is a photodefinable material with different photodefinable characteristics than the photodefinable characteristics of the material of the photo-machinable material layer.

7. The device of claim 1, wherein a material of the photo-machinable material layer is an alkali-containing material.

8. The device of claim 1, wherein a material of the photo-machinable material layer is an alkali-free material.

9. The device of claim 1, wherein the photo-machinable material layer is transparent.

10. The device of claim 1, wherein the other material layer is formed of an insulating material extending continuously under at least five of the plurality of structures.

11. The device of claim 1, wherein the plurality of structures defined within the photo-machinable material layer includes more than one million openings within the photo-machinable material layer.

12. The device of claim 1, wherein the plurality of structures defined within the photo-machinable material layer includes more than one million openings within the photo-machinable material layer.

13. The device of claim 12, wherein each of the at least one million openings exhibits maximum width of less than one hundred fifty micrometers and a maximum depth of less than ten micrometers.

14. The device of claim 1, wherein at least two of the plurality of structures defined within the photo-machinable material layer are openings within the photo-machinable material layer, and wherein each of the at least two openings exhibits maximum width of less than one hundred fifty micrometers and a maximum depth of less than ten micrometers.

15. An assembly panel device, the device comprising:
a photo-machinable material layer; and
a plurality of structures defined within the photo-machinable material layer, wherein the plurality of structures includes more than one million openings within the photo-machinable material layer, and wherein each of the at least one million openings exhibits maximum width of less than one hundred fifty micrometers and a maximum depth of less than ten micrometers.

16. The device of claim 15, wherein at least some of the more than one million openings within the photo-machinable material layer vary in size.

17. The device of claim 15, wherein at least some of the more than one million openings within the photo-machinable material layer vary in depth.

18. The device of claim 15, wherein at least some of the more than one million openings within the photo-machinable material layer vary in shape.

19. The device of claim 15, wherein each of the more than one million openings within the photo-machinable material layer extends only partially through the photo-machinable material layer such that a bottom of each of the respective openings is within the photo-machinable material layer.

20. The device of claim 15, the device further comprising:
another material layer, wherein the other material layer is formed of a material different from the material of the photo-machinable material layer, and wherein the other material layer is connected to the photo-machinable material layer; and
wherein the plurality of structures extend through the photo-machinable material layer such that a bottom of each of the respective openings is a portion of a surface of the other material layer.

21. The device of claim 20, wherein the material of the other material layer is a material selected from a group consisting of: glass, glass-ceramic, ceramic, polymer, and metal.

22. The device of claim 20, wherein the material of the other material layer is a photodefinable material with different photodefinable characteristics than the photodefinable characteristics of the material of the photo-machinable material layer.

23. The device of claim 15, wherein a material of the photo-machinable material layer is an alkali-containing material.

24. The device of claim 15, wherein a material of the photo-machinable material layer is an alkali-free material.

25. The device of claim 15, wherein the photo-machinable material layer is transparent.

26. An assembly panel device, the device comprising:
a photo-machinable material layer;
another material layer, wherein the other material layer is formed of a material different from the material of the photo-machinable material layer, and wherein the other material layer is connected to the photo-machinable material layer; and
more than one million openings defined within the photo-machinable material layer, and wherein each of the at least one million openings exhibits maximum width of less than one hundred fifty micrometers and a maximum depth of less than ten micrometers.

* * * * *